United States Patent [19]

Yonezawa

[11] 4,429,222
[45] Jan. 31, 1984

[54] TRANSMISSION ELECTRON MICROSCOPE
[75] Inventor: Akira Yonezawa, Fussa, Japan
[73] Assignee: International Precision Incorporated, Tokyo, Japan
[21] Appl. No.: 309,777
[22] Filed: Jan. 8, 1981
[30] Foreign Application Priority Data Oct. 7, 1980 [JP] Japan ................................ 55-139392

[51] Int. Cl.³ .............................................. H01J 37/26
[52] U.S. Cl. .................................................... 250/311
[58] Field of Search ............. 250/311, 396 R, 396 ML

[56] References Cited

U.S. PATENT DOCUMENTS 3,715,582  2/1973  Akahori et al. ...................... 250/396
4,072,356  2/1978  Sanderson ................. 250/396 ML X Primary Examiner—Alfred E. Smith
Assistant Examiner—Jack I. Berman
Attorney, Agent, or Firm—Lane, Aitken & Kananen

[57] ABSTRACT

A transmission electron microscope comprises an objective lens and a condenser lens which are so arranged that excitation of the condenser lens can be varied in association with variation in excitation of the objective lens. A cross-over point which is produced by the condenser lens of the last stage in the non-excited state of the objective lens is caused to coincide with a preselected position on the optical axis of the microscope, which position is determined in accordance with magnitude of excitation of the objective lens. The position of a convergence point of the electron beam produced downstream of a specimen to be observed is maintained substantially constant independently from variations in excitation of the objective lens. The direction in which the electron beam impinges on specimen at a point to be observed is maintained substantially constant independently from variation in excitation of the objective lens. An image of improved quality is obtained without the field of view being narrowed, while observation can be made with constant magnification independently from different focus states. Aberrations are significantly decreased.

2 Claims, 5 Drawing Figures

FIG. 2 (a)
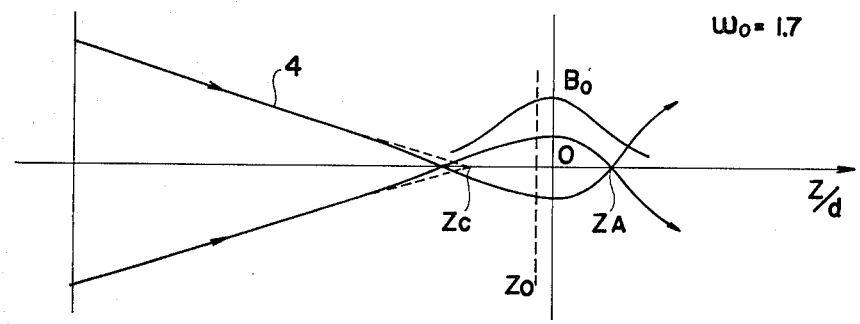
FIG. 2 (b)
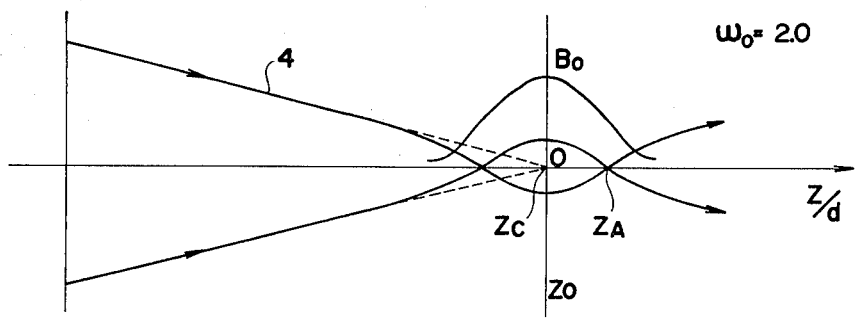
FIG. 2 (c)

TRANSMISSION ELECTRON MICROSCOPE

BACKGROUND OF THE INVENTION

1. Field of the Invention

The present invention relates in general to a transmission electron microscope. In particular, the invention concerns an improvement of a specimen illuminating or irradiating lens system composed of condenser lens and objective lens.

2. Description of the Prior Art

In a conventional high resolution electron microscope, a specimen is placed at a position $Z_o$ in a gap defined by pole pieces of an objective lens so that a magnetic field $B_z(Z)$ is produced around the position of the specimen in a bell-like distribution pattern, as can be seen from FIG. 1 of the accompanying drawings. In the hitherto known electron microscope of this type, the objective lens and the condenser lens are controlled independently from each other. Accordingly, inclination $x_o'$ of an electron beam impinging on the specimen at a point $x_o$ is caused to vary when excitation of the objective lens is varied even if the excitation of the condenser lens is maintained constant. Further, variation in excitation of the objective lens will bring about variation in the position of convergence point of electron beam located at the side downstream of the specimen, even if excitation of the objective lens is so feeble that the intensity of magnetic field prevailing around the specimen can be neglected.

As the consequence, when the focussing excitation of the objective lens is varied in correspondence to variation in the position of the specimen such as tilting thereof, the position of the convergence point of the electron beam formed on the optical axis downstream of the specimen is displaced from the position of an objective aperture, involving reduction in the field of view or resulting in appreciable off-axis aberrations in a peripheral portion of the field of view due to remarkable variation in the direction in which the electron beam impinges on the specimen at a given point or area being observed. Thus, difficulty is encountered in producing an image of a satisfactory quality. Further, there arise such cases where the specimen disposed at a fixed position is to be observed in an under-focus or over-focus state under excitation of the objective lens which is different from the level employed for the observation in the just focus state. In these cases, magnification for observation in the under- or over-focus state will differ correspondingly from the magnification in the just focus state or the field of view is reduced by the objective aperture, to disadvantages. Such undesirable phenomena often occur in the observation of magnetic material or in which an image of a high contrast is to be produced with a relatively low magnification.

SUMMARY OF THE INVENTION

An object of the present invention is to provide an improved electron microscope which is substantially immune to the shortcomings of the conventional electron microscopes described above.

In view of the above and other objects which will become apparent as description proceeds, there is provided according to an aspect of the invention a transmission electron microscope, comprising an objective lens and a condenser lens which are so arranged that excitation of the condenser lens can be varied in association with variation in excitation of the objective lens, wherein a cross-over point which is produced by the condenser lens of the last stage in the non-excited state of the objective lens is caused to coincide with a preselected position on the optical axis of the microscope, which position is determined in accordance with magnitude of excitation of the objective lens, whereby the position of a convergence point of the electron beam produced downstream of a specimen to be observed is maintained substantially constant independently from variations in excitation of the objective lens. According to another aspect of the invention, the incident direction in which the electron beam impinges on a specimen at a point to be observed is maintained substantially constant independently from variation in excitation of the objective lens.

With the arrangement of the electron microscope according to the invention, reduction in the field of view by the objective aperture which would otherwise occur can be prevented, while off-axis aberrations can be suppressed to minimum, whereby microscope images of a high quality can be obtained. Further, observation in the under-focus or over-focus state can be effected without being accompanied by variations in magnification.

BRIEF DESCRIPTION OF THE DRAWINGS

FIGS. 2(a) to 2(c) illustrate schematically manners in which an electron beam is converged at a preselected fixed point independently from varied excitations of an objective lens by varying correspondingly a position of a cross-over point of the electron beam formed by a condenser lens of the last stage;

DETAILED DESCRIPTION OF THE PREFERRED EMBODIMENTS

Now, the invention will be described by way of example in conjunction with the accompanying drawings.

Figure 1:
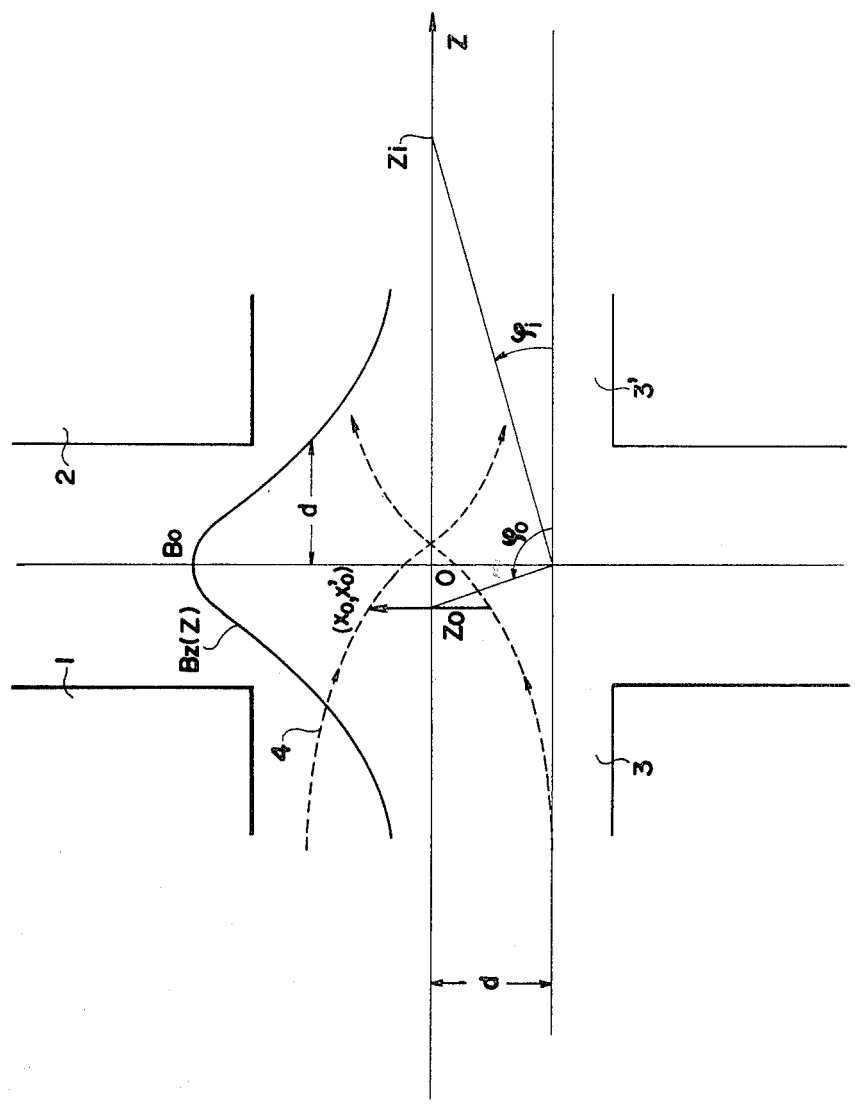
FIG. 1 illustrates schematically an arrangement of a symmetrical objective lens of an electron microscope to illustrate the principle of the invention.

Referring to FIG. 1 which shows schematically an arrangement of a symmetrical field type objective lens for an electron microscope, the objective lens is composed of an upper magnetic pole piece 1 and a lower magnetic pole piece 2 disposed in opposition to the upper magnetic pole piece 1 with a predetermined distance therefrom. Bores 3 and 3' are formed in the upper and the lower magnetic pole piece 1 and 2, respectively, for allowing electron beam to pass therethrough. The centers of the bores 3 and 3' coincide with an optical axis Z of the objective lens. With such arrangement, the travel path of the electron beam which passes through a point $x_o$ on a specimen placed at a position $Z_o$ in a gap defined between the pole pieces of the objective lens with a magnetomotive force J being applied between the upper and the lower magnetic pole pieces can be approximately determined through analytical or numerical calculation.

In general, in the objective lens of a rotationally symmetric magnetic field type having an optical axis Z, the path of the paraxial electron beam can be determined as a solution of the following equation, provided that rotation of electron around the axis is not taken into consideration:

$$\frac{d^2 \times (Z)}{dz^2} + \frac{eBz^2(Z)}{8m_oU^*} \times (Z) = 0 \quad (1)$$

where Bz(Z) represents distribution of the magnetic field along the optical axis, e represents electric charge of an electron, $m_o$ represents mass of an electron, and $U^*$ represents a relativistically corrected accelerating voltage. For particulars, reference is to be made to a literature "Grundlagen der Elektronenoptik" of W. Glaser.

As is well known in the art, when distribution of the magnetic field of the symmetrical objective lens having the upper and the lower pole piece bores of a same diameter is approximated to a bell-like distribution, the path of the electron beam can be analytically determined in accordance with the following expression:

$$Bz(Z) = \frac{B_o}{1 + \left(\frac{z}{d}\right)^2} \quad (2)$$

where $B_o$ represents magnetic flux density at the center O of the objective lens taken as the origin and d represents a halfwidth of the magnetic field.

When $\phi_o$ represents an angle formed around an intersection between a first line extending through the center O perpendicular to the optical axis Z and a second line extending parallel to the optical axis and spaced therefrom by the halfwidth d and defined between the second line and the specimen position $Z_o$, as shown in FIG. 1, the specimen position $Z_o$ as well as the position $Z_i$ of an image plane is given by the following expressions:

$$\left. \begin{array}{l} Z_o = d \cot\phi_o \\ Z_i = d \cot\phi_1 \end{array} \right\} \quad (3)$$

Further, the parameter $\omega_o$ representing the excitation of the objective lens is determined in accordance with the following expressions:

$$\left. \begin{array}{l} \omega_o = \sqrt{1 + k_o^2} \\ k_o^2 = \frac{eB_o^2d^2}{8m_oU^*} \alpha J_o^2/U^* \end{array} \right\} \quad (4)$$

The path x(Z) of the electron beam which satisfies at the specimen position $Z_o$ the conditions that $x = x_o$ and $X' = x_o'$ is determined on the basis of the following expression:

$$x(Z) = x_oS(Z) + x_o't(Z) \quad (5)$$

where functions S(Z) and t(Z) are solutions of the equation (1) which satisfy for $Z_o$ the following conditions:

$$\left\{ \begin{array}{l} S(Z_o) = 1 \\ S'(Z_o) = 0 \end{array} \right. \quad \left\{ \begin{array}{l} t(Z_o) = 0 \\ t'(Z_o) = 1 \end{array} \right. \quad (6)$$

For particulars, reference should be made to the literature "Elektronenoptik" cited above.

In accordance with the expression (5), the initial condition $x_o/x_o'$ for realizing the aimed object described hereinbefore can be determined for a given excitation of the objective lens. More specifically, the initial conditions $x_o/x_o'$ can be definitely determined, provided that the convergence point (which is assumed to be at $Z_o$ and referred to also as the cross-over point) of the electron beam converged only by the condenser lens without excitation of the objective lens is given.

By way of example only, FIGS. 2(a), 2(b) and 2(c) illustrate schematically the paths of electron beam 4 converged to a predetermined point $Z_A(=d)$ on the optical axis Z for the excitations $\omega_o$ of the objective lens so selected that $\omega_o = 1.7$, $\omega_o = 2.0$ and $\omega_o = 2.4$ together with the convergence points $Z_c$ of the electron beam 4 produced only through excitation of the condenser lens and the specimen positions $Z_o$ for the various excitations $\frac{2}{3}_o$ enumerated above in the case where the image of the specimen is focused at a point at infinity. It becomes necessary to change or vary the excitation of the objective lens, when the specimen position $Z_o$ is varied, as illustrated in FIGS. 2(a) and 2(c), due to tilting of the specimen or other causes, departing from the state in which the electron beam having been transmitted through the specimen disposed at the center 0 of the objective lens is focused to the predetermined point $Z_A$ (=d), as illustrated in FIG. 2(b). In order to assure that the electron beam is constantly converged or focussed to the predetermined point $Z_A$ notwithstanding variations in excitation of the objective lens, the convergence point $Z_c$ of the electron beam determined through excitation only of the condenser lens has to be varied correspondingly. The convergence point $Z_c$ is determined as the function of the excitation $\omega_o$ of the objective lens and the position of the fixed point $Z_A$ (=d·cot$\phi_A$) in accordance with the following equation:

$$Z_c = d \cdot \omega_o \cdot \cot\{\omega_o(\phi_A - \pi)\} \quad (7)$$

Figure 3:
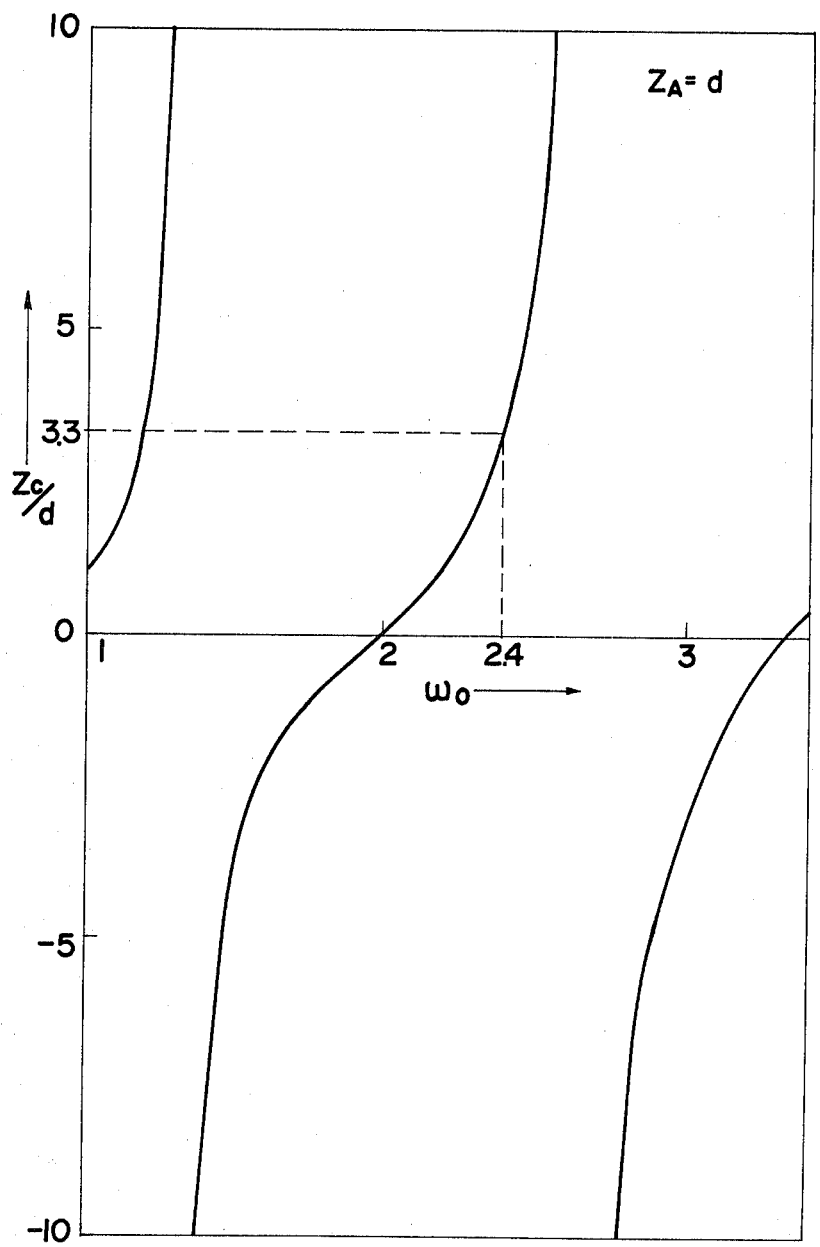
FIG. 3 illustrates graphically a relation between the position of the cross-over point of the electron beam produced only by the condenser lens and excitation of the objective lens, which relation is required to be satisfied for converging the electron beam at the preselected fixed point independently from variations in excitation of the objective lens as illustrated in FIG. 2.

Relation between the convergence point (represented by $Z_c/d$) of the electron beam 4 focussed only by the condenser lens and magnitude of excitation $\omega_o$ of the objective lens is schematically illustrated in FIG. 3.

As can be seen from illustrations of FIGS. 2 and 3, the electron beam is focussed to the same fixed point $Z_A = d$ in both cases where the convergence point $Z_c/d$ produced under excitation only of the condenser lens is set at 0 for the excitation intensity $\omega_o$ of the objective lens equal to 2 and where the convergence point $Z_c/d$ is set substantially equal to 3.3 for the excitation intensity $\omega_o$ of the objective lens equal to 2.4 (as indicated by a broken line in FIG. 3). Accordingly, even when the excitation $\omega_o$ of the objective lens is varied in correspondence to variation in the position $Z_o$ of the specimen as brought about by tilting or inclination of the specimen, it is possible to focus or converge the electron beam having been transmitted through the specimen constantly at the predetermined or fixed point $Z_A$ on the optical axis Z, by displacing the position of the convergence point $Z_c$ of the electron beam focussed only by the condenser lens along the curve shown in FIG. 3 by correspondingly varying excitation of the condenser lens. Thus, it is possible to prevent the field of view from being reduced by an objective aperture disposed at the fixed or constant point $Z_A$.

Figure 4:
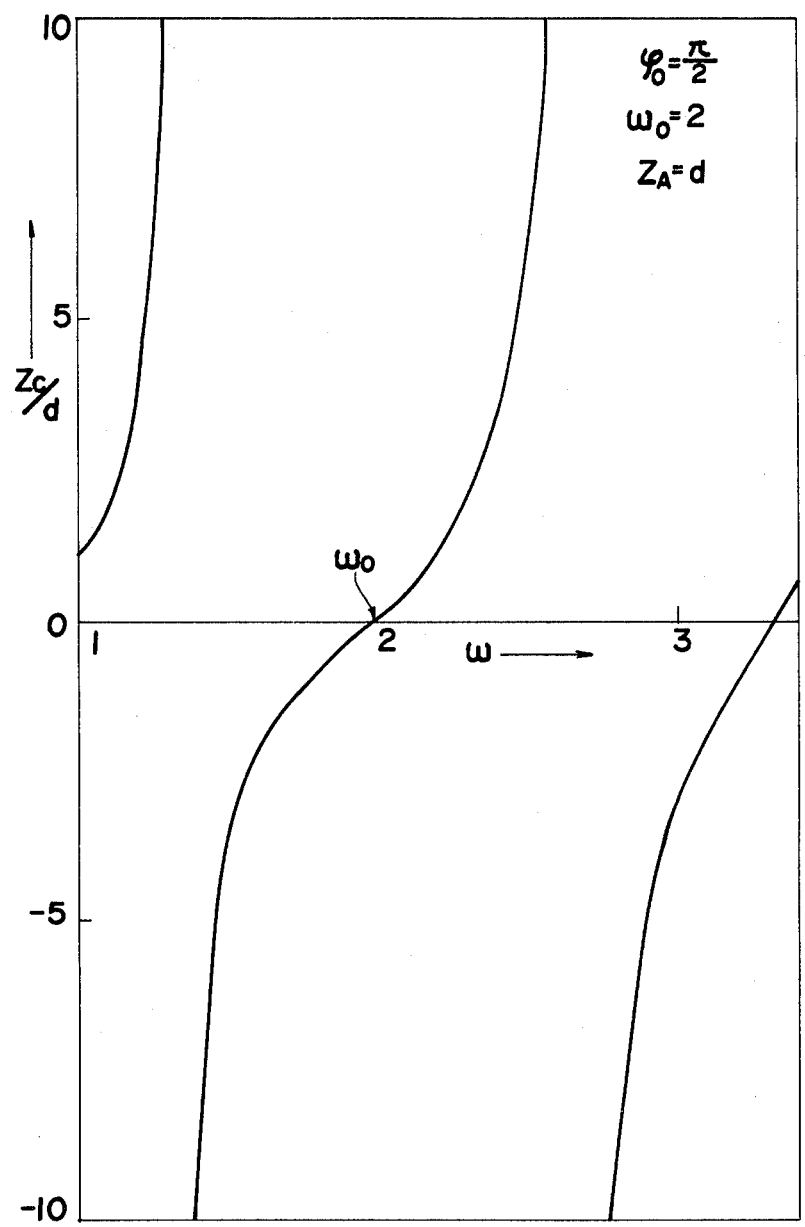
FIG. 4 graphically illustrates a relation between the position of the cross-over point produced only by the condenser lens and excitation of the objective lens on the assumption that a specimen is positioned at the center of the objective lens and that excitation of the objective lens is equal to 2, which relation is required to be satisfied for assuring a same magnification independently from focus states.

Further, in order to prevent magnification from being varied when observation is made in the state of an under- or over-focus by varying correspondingly the excitation of the objective lens while maintaining the specimen at the fixed position $Z_o$, excitation of the condenser lens is varied in correspondence to variation in excitation of the objective lens so that the electron beam transmitted the specimen is constantly focussed at the position $Z_A$ which can be defined as follows:

$$Z_A = d \cdot \cot(\phi_o - \pi/2\omega_o) \tag{8}$$

where $\omega_o$ represents the excitation of the objective lens in the just focused state. By way of example, when the specimen is positioned at the center of the objective lens (i.e. $\phi_o = \pi/2$) with excitation of the objective lens being set equal to 2, then $Z_A = d$ from the expression (8). FIG. 4 illustrates graphically the position $Z_c$ of the convergence point of electron beams converged only by the condenser lens as a function of the excitation $\omega_o$ of the objective lens. In other words, the graph illustrated in FIG. 4 is plotted on the same conditions as the graph shown in FIG. 3 except that the specimen is fixedly positioned at the center of the objective lens and that excitation for the just focus is so set that $\omega_o = 2$. As can be seen from FIG. 4, when excitation of the objective lens is varied while maintaining the specimen $Z_o$ at the fixed position, then image produced in the under- or over-focus state can be observed with the same magnification as that of the just focus state, by varying excitation of the condenser lens so that the convergence point of the electron beam converged only by the condenser lens coincides with the position $Z_c$ shown in FIG. 4. It goes without saying that magnitude of the parameter $Z_c/d$ becomes different from the one adopted in plotting the curve shown in FIG. 4, when $\phi_o \neq \pi/2$ and/or $\omega_o \neq 2$. However, similar curves can be obtained from calculations on the basis of the expressions (7) and (8).

The effect brought about by varying excitation of the condenser lens in correspondence with variation in excitation of the objective lens in the manner described above can be made use of for other various purposes in addition to setting of the convergence point of the electron beam at the fixed position $Z_A$ or assuring same magnification. For example, there may arise such situation in which the inclination $x_o'$ of the electron beam impinging on the specimen at the point $x_o$ be maintained at a constant value. This can be easily accomplished by varying excitation of the condenser lens in association with variation in excitation of the objective lens. In particular, illumination or irradiation of the specimen with the electron beam 4 in parallel with the optical axis Z (i.e. perpendicular to the specimen) for observation with a low magnification is advantageous in that off-axis aberrations are significantly reduced to thereby assure a wide field of view with an improved quality of image.

Figure 5:
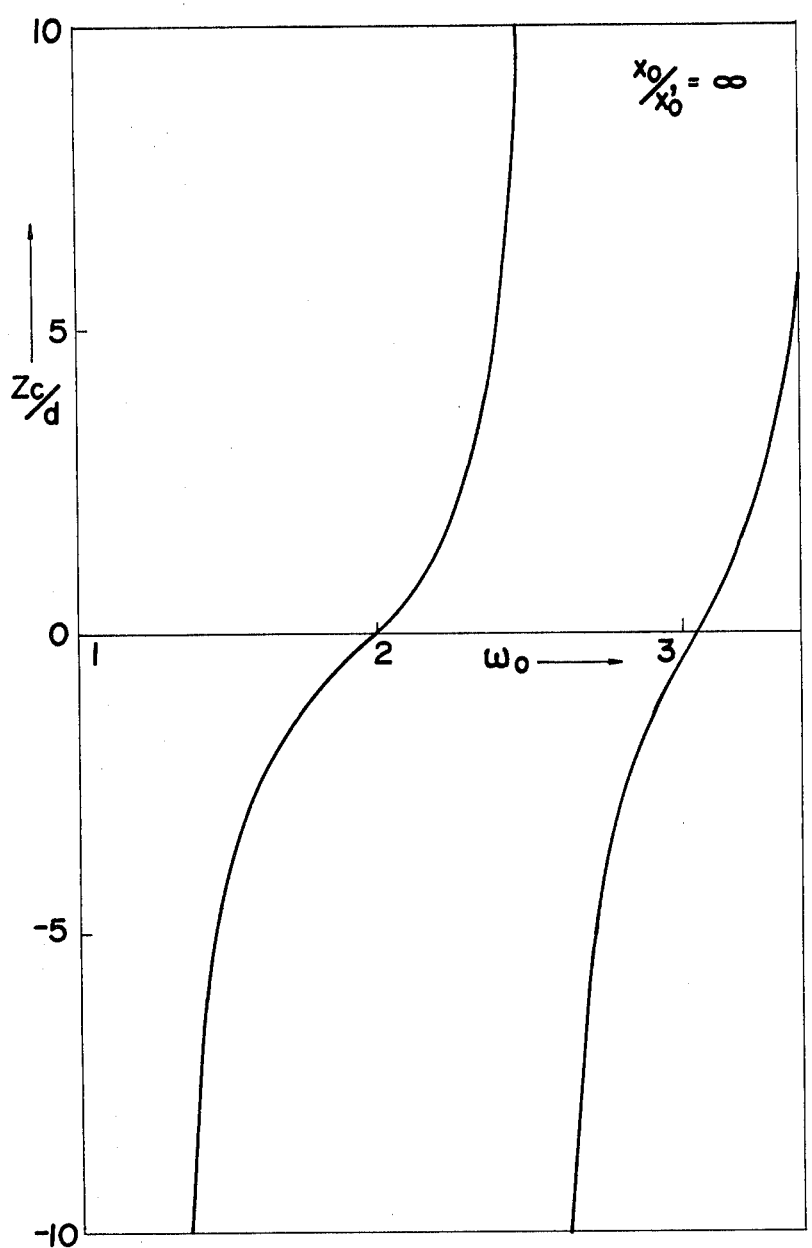
FIG. 5 illustrates schematically a relation between the cross over point by the condenser lens and excitation of the objective lens, which relation is required to be satisfied for the electron beam to impinge on the specimen at a given point or area thereof in parallel to the optical axis of the electron microscope.

In FIG. 5, there is illustrated graphically a relation between the convergence point $Z_c$ of the electron beam converged only by the condenser lens and the intensity or magnitude of excitation $\omega_o$ of the objective lens in the case where the condition that the specimen is irradiated with the electron beam in parallel with the optical axis is satisfied. In other words, it is possible to illuminate the specimen with the electron beam perpendicularly thereto by varying excitation of the condenser lens in the manner represented by the curve shown in FIG. 5.

The graphs depicted in FIGS. 3, 4 and 5 are plotted on the basis of the analytical processing made on the assumption that distribution of the magnetic field produced by the objective lens can be approximated by the bell-like distribution pattern. The results however almost coincide with values determined strictively without resorting to the approximation.

By the way, it has been known in the electron microscope that excitation of the condenser lens is changed upon changingover of the observation mode between STEM and TEM modes. Further, it is also known that excitation of the condenser lens is set to a fixed level at the time when excitation of the objective lens is shut off for observation with a small magnification. However, in either case, it is impossible to maintain constant or invariable the position $Z_A$ of the convergence point of the electron beam converged downstream of the specimen or hold the direction of the electron beam impinging on the specimen at a given point thereof to be constant independently from variations in excitation of the objective lens. Thus, the teaching of the present invention differs fundamentally from the prior art.

As will be appreciated from the foregoing description, the present invention has provided an electron microscope in which the reduction of the field of view as well as the off-axis aberrations as brought about due to variation in excitation of the objective lens can be suppressed to minimum to thereby assure a significantly improved quality of image, while allowing observation in the under-focus or over-focus state with same magnification as that of the observation in the just focus state, by varying excitation of the condenser lens in predetermined relation to variation in excitation of the objective lens.

I claim:

1. A transmission electron microscope, comprising an objective lens and a condenser lens which are so arranged that excitation of said condenser lens can be varied in association with variation in excitation of said objective lens, wherein a cross-over point which is produced by the condenser lens of the last stage in the non-excited state of said objective lens is caused to coincide with a preselected position on the optical axis of said microscope, which position is determined in accordance with magnitude of excitation of said objective lens, whereby the position of a convergence point of the electron beam formed downstream of a specimen to be observed is maintained substantially constant independently from variations in excitation of said objective lens.

2. A transmission electron microscope, comprising an objective lens and a condenser lens which are so arranged that excitation of said condenser lens can be varied in association with variation in excitation of said objective lens, wherein a cross-over point which is produced by the condenser lens of the last stage in the non-excited state of said objective lens is caused to coincide with a preselected position on the optical axis of said microscope, which position is determined in accordance with magnitude of excitation of said objective lens, whereby the incident direction in which the electron beam impinges on a specimen at a point to be observed is maintained substantially constant independently from variation in excitation of said objective lens.

* * * * *

UNITED STATES PATENT AND TRADEMARK OFFICE
CERTIFICATE OF CORRECTION

PATENT NO. : 4,429,222

DATED : January 31, 1984

INVENTOR(S) : Akira Yonezawa

It is certified that error appears in the above—identified patent and that said Letters Patent is hereby corrected as shown below:

Column 2, line 53, after "point" insert -- produced--.

Column 3, after (3), insert -- where $\phi_i = \phi_o - \pi/\omega_o \cdot \frac{\pi}{\omega_o}$ .--

Column 4, line 3, change "X'" to --x'--

Column 4, line 34, change "$\frac{2}{3o}$" to --$\omega_o$--.

Signed and Sealed this

Twenty-fourth Day of July 1984

[SEAL]

Attest:

GERALD J. MOSSINGHOFF

Attesting Officer     Commissioner of Patents and Trademarks